United States Patent [19]

Higuchi et al.

[11] Patent Number: 4,527,077
[45] Date of Patent: Jul. 2, 1985

[54] OUTPUT CIRCUIT OF A SEMICONDUCTOR DEVICE

[75] Inventors: Mitsuo Higuchi, Tokyo; Masanobu Yoshida, Kawaguchi, both of Japan

[73] Assignee: Fujitsu Limited, Kawasaki, Japan

[21] Appl. No.: 393,551

[22] Filed: Jun. 30, 1982

[30] Foreign Application Priority Data

Jun. 30, 1981 [JP] Japan .................................. 56-100509

[51] Int. Cl.³ ................ H03K 19/003; H03K 19/017; H03K 17/16
[52] U.S. Cl. .............................. 307/443; 307/200 B; 307/542; 307/551; 307/555
[58] Field of Search ................ 307/296 R, 297, 443, 307/542, 551, 561, 555, 568, 200 B; 323/299, 303

[56] References Cited

U.S. PATENT DOCUMENTS

| | | |
|---|---|---|
| 2,853,630 | 9/1958 | Lane et al. |
| 3,508,084 | 4/1970 | Warner |
| 3,723,759 | 3/1973 | Giguere |
| 4,065,678 | 12/1977 | Reese et al. |
| 4,174,535 | 11/1979 | Mueller et al. ...................... 323/303 |

Primary Examiner—John Zazworsky
Attorney, Agent, or Firm—Staas & Halsey

[57] ABSTRACT

An output circuit of a semiconductor device for suppressing erroneous operation due to potential variations of the power supply line or the ground line. The output circuit comprises an output stage inverter connected between the power supply line and the ground line and a clamping circuit for clamping the voltages applied to the output stage inverter. A large instantaneous current which flows through the output stage inverter during a transition of state is greatly suppressed so that erroneous operation is prevented.

5 Claims, 8 Drawing Figures

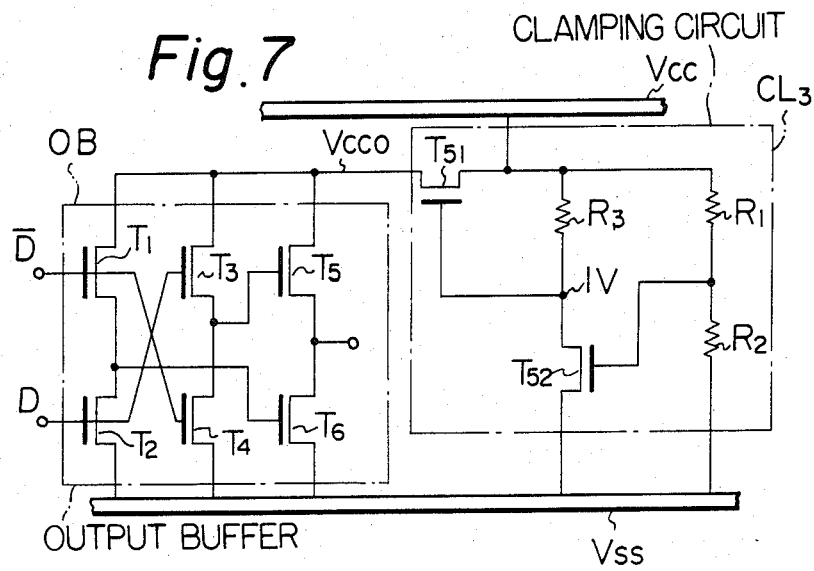
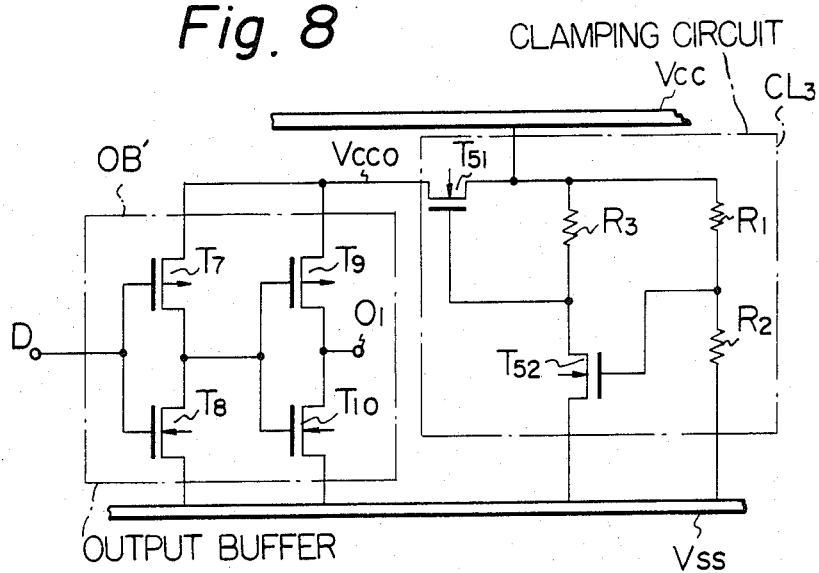

OUTPUT CIRCUIT OF A SEMICONDUCTOR DEVICE

BACKGROUND OF THE INVENTION

1. Field of the Invention

The present invention relates to an output circuit of a semiconductor device, and, more particularly, to an output circuit of a semiconductor device in which erroneous operation due to the potential variations of the power supply line, or the ground line is suppressed.

2. Description of the Prior Art

Recently, the operating speed of a semiconductor device, for example, a metal-insulator semiconductor (MIS) device or a metal-oxide semiconductor (MOS) memory device, has been increased more and more. In order to increase the operating speed, a conventional approach has been to increase the W/L of the output transistors, W representing the channel width and L representing the channel length of each output MOS transistor. By increasing the W/L, the fall time and the rise time of the output waveform is shortened. More precisely, when the W/L is increased, the mutual conductance gm is also increased so that when the output transistor turns on or off and the output potential changes from a high level (H level) to a low level (L level) or from the L level to the H level, a large current instantaneously flows through the output transistor. As a result of this large current, the time required for charging or discharging the load capacitances included in the wirings connected to the output of the output transistors is short. Therefore, a rapid rise or fall of the output waveform can be obtained. A large current also flows through one of the output transistors when the power supply line voltage is shifted to a higher level or when the ground line voltage is shifted to a lower level. Usually, the power supply line voltage of integrated circuits is 5 volts±0.25 volts and the ground line voltage of integrated circuits is zero volts ±0.25 volts. When the power supply line voltage is shifted to 5.25 volts or when the ground line voltage is shifted to −0.25 volts, an even larger current flows through one of the output transistors because a higher voltage is applied to the gate of one of the output transistors.

Due to the large current which flows through one of the output transistors during a transition of its state, the operating speed of the integrated circuit is increased. However, the large current which flows through one of the output transistors creates the following problem. That is, generally, the power supply line or the ground line, to which the output transistors and the internal integrated circuit are connected, has a resistance and an inductance. When an instantaneous large current flows from the power supply line through one of the output transistors to the ground line, the potential of the power supply line or the ground line is instantaneously changed due to the resistance or the inductance. This instantaneous variation in potential causes a noise for the internal integrated circuit. As a result, during transition of the ouput from the output transistors, erroneous operation of the internal integrated circuit of, for example, a sense amplifier in a dynamic memory or an input buffer or a sense amplifier in a static memory may result, or erroneous data may be supplied to the external integrated circuit.

SUMMARY OF THE INVENTION

Accordingly, a primary object of the present invention is to prevent an erroneous operation in a semiconductor device due to voltage variations of the power supply line or the ground line.

Another object of the present invention is to clamp the gate voltage of the output transistor in a semiconductor device so that large instantaneous currents are not produced.

In order to achieve the above objects, there is provided an output circuit of a semiconductor device comprising: a first MOS transistor and a second MOS transistor connected in series between a power supply line and a ground line. The first and second MOS transistors have gates operatively receiving a first signal and a second signal, respectively. The first MOS transistor and the second MOS transistor are turned on and off or are turned off and on, respectively, in response to the H level or the L level of the first signal and the second signal. According to the invention, the output circuit further comprises a clamping circuit for clamping the potentials of the first signal and the second signal within a predetermined level.

BRIEF DESCRIPTION OF THE DRAWINGS

The foregoing objects and other objects, as well as the characteristic features of the invention, will become more apparent and more readily understandable from the following description with reference to the accompanying drawings, wherein:

FIG. 2 is a block circuit diagram of the general structure of a system including the output buffer of FIG. 1 connected to an internal integrated circuit and an external integrated circuit;

FIG. 3 is a graph of the relation between the potential at the output end of the output buffer and the potential at the output end of an input buffer in the external integrated circuit;

FIG. 4 is a circuit diagram of a main portion of a well-known semiconductor memory device employed as the internal integrated circuit and the output buffer;

FIG. 5 is a general plan view of a well-known one-chip semiconductor memory device; and FIGS. 6 through 8 are circuit diagrams of output buffers according to the first, second, and third embodiments of the present invention, respectively.

DESCRIPTION OF THE PREFERRED EMBODIMENTS

Now the embodiments of the present invention will be described in comparison with conventional examples, with reference to the accompanying drawings.

FIGS. 1 through 5 are drawings used for explaining the problems of the conventional circuits.

Figure 1:
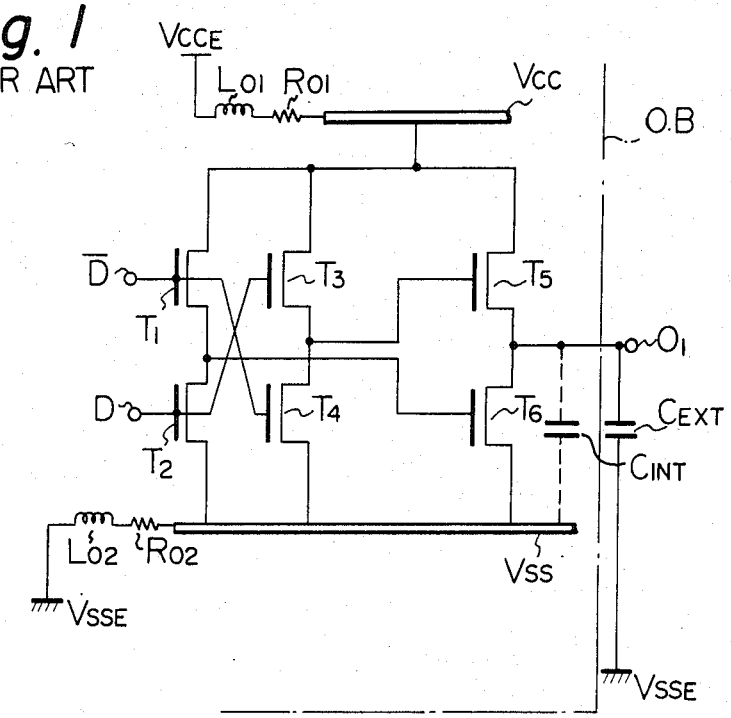
FIG. 1 is a circuit diagram of a conventional output buffer in a semiconductor device.

FIG. 1 is a circuit diagram illustrating a conventional output buffer in a semiconductor integrated device. In the figure, the enhancement-type N-MOS transistors $T_1$ and $T_2$ connected in series constitute an input stage inverter; the enhancement-type N-MOS transistors $T_3$ and $T_4$ connected in series constitute the intermediate stage inverter; and the enhancement-type N-MOS transistors $T_5$ and $T_6$ connected in series constitute the final stage inverter. Each inverter is connected between a power supply line $V_{CC}$ and a ground line $V_{SS}$. Thus, each inverter constitutes an enhancement(E)-enhancement(E) push-pull circuit. D and $\bar{D}$ are the input ends of this output buffer OB, and $O_1$ is the output end of the output buffer OB. The input ends D and $\bar{D}$ are connected to the internal integrated circuit. The output end $O_1$ is operatively connected to an external integrated circuit.

$V_{CCE}$ is an external power supply. The power supply line $V_{CC}$ is connected through the resistance $R_{01}$ and the inductance $L_{01}$ to the external power supply $V_{CCE}$. The resistance $R_{01}$ and the inductance $L_{01}$ are included in the power supply line $V_{CC}$. $V_{SSE}$ is an external ground. The ground line $V_{SS}$ is connected through the resistance $R_{02}$ and the inductance $L_{02}$ to the external ground $V_{SSE}$. The resistance $R_{02}$ and the inductance $L_{02}$ are included in the ground line $V_{SS}$.

At the output end $O_1$ of the output buffer OB, there is a load capacitance due to (1) the capacitance $C_{INT}$ derived from the junction capacitance between the source of the MOS transistor $T_5$ and the drain of the MOS transistor $T_6$ plus the wiring capacitance and (2) the external capacitance $C_{EXT}$ derived from the gate capacitance of an external transistor operatively connected to the output end $O_1$. This load capacitance causes the fall time or the rise time of the output waveform at the output end $O_1$ to be longer. To shorten the fall time or the rise time, the W/L of the output transistor $T_5$ or $T_6$ is made to be very large in comparison with the W/L of the internal integrated circuit transistors. Due to this large W/L, a large instantaneous current flows through one of the output transistors $T_5$ and $T_6$ during a transition of the output potential at the output end $O_1$. More precisely, when the potentials at the input ends D and $\bar{D}$ are the H level and the L level, respectively, the transistors $T_2$ and $T_3$ are in an on state and the transistors $T_1$ and $T_4$ are in an off state. Accordingly, the output transistor $T_5$ receives at its gate the H level potential so that it is in an on state. On the other hand, the output transistor $T_6$ receives at its gate the L level potential so that it is in an off state. Thus, in this state, the potential at the output terminal $O_1$ is the H level and the capacitance at the output terminal is charged up. During the transition of the potential at the output end $O_1$ from the H level to the L level, which is caused by the change in the potentials at the input ends D and $\bar{D}$ from the H level and the L level to the L level and the H level, respectively, charges stored in the capacitance at the output terminal $O_1$ are rapidly discharged through the transistor $T_6$, which now changes to an on state. This discharge causes a large instantaneous current to flow through the ground line $V_{SS}$, and a voltage drop is produced across the resistance $R_{02}$ and the inductance $L_{02}$. As a result, the potential of the ground line is instantaneously raised. In contrast, during the transition of the potential at the output end $O_1$ from the L level to the H level, the output transistor $T_5$ changes from the off state to the on state, and the output transistor $T_6$ changes from the on state to the off state. The capacitance at the terminal $O_1$ is, in this condition, rapidly charged up due to the large current flowing through the output transistor $T_5$, which is now changed from the off to the on state. Accordingly, a voltage drop is also produced across the resistance $R_{01}$ and the inductance $L_{01}$. As a result, the potential of the power supply line $V_{CC}$ is instantaneously lowered.

The above-mentioned instantaneous increase in the ground line potential or the instantaneous decrease in the power supply line potential causes various problems in the internal integrated circuit or the external integrated circuit connected to the output buffer OB. These problems will be described in more detail with reference to FIGS. 2 through 5.

Figure 2:
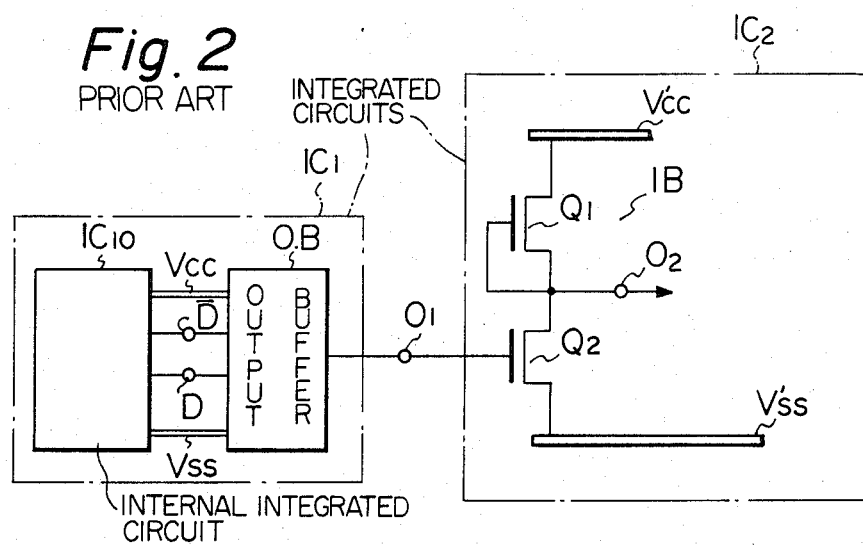
FIGS. 2 through 5 are drawings for explaining the problems of the circuit of FIG. 1 and, specifically.

FIG. 2 is a block circuit diagram illustrating the general structure of a system including the output buffer OB of FIG. 1 connected to an internal integrated circuit and an external integrated circuit. In FIG. 2, the semiconductor device $IC_1$ includes an output buffer OB which is connected through the ground line $V_{SS}$, the power supply line $V_{CC}$, and the input ends D and $\bar{D}$ to an internal integrated circuit $IC_{10}$. The output end $O_1$ is connected to an input buffer IB of an external integrated circuit $IC_2$. The input buffer IB comprises MOS transistors $Q_1$ and $Q_2$ connected in series between a power supply line $V_{CC}'$ and a ground line $V_{SS}'$ which are electrically disconnected from the power supply line $V_{CC}$ and the ground line $V_{SS}$ in the integrated circuit $IC_1$. $O_2$ is the output end of this input buffer IB. In response to the H level or the L level at the output end $O_1$ of the output buffer OB, the output end $O_2$ of the input buffer IB becomes the L level or the H level, respectively. The problem in the system of FIG. 2 will be explained with reference to FIG. 3.

Figure 3:
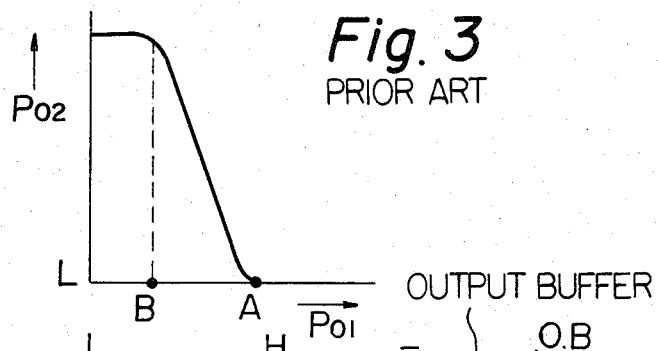

FIG. 3 is a graph illustrating the relation between the potential at the output end $O_1$ of the output buffer OB and the potential at the output end $O_2$ of the input buffer IB. As FIG. 3 shows, the potential $P_{02}$ at the output end $O_2$ changes from the H level to the L level in accordance with the change in the potential $P_{01}$ at the output end $O_1$ from the L level to the H level. If it is assumed that the potential $P_{01}$ at the output end $O_1$ is at the H level represented by point A, the output potential $P_{01}$ at the output end $O_1$ is lowered when the potential of the power supply line $V_{CC}$ is lowered due to a large instantaneous current flowing through one of the output transistors. If the output potential $P_{01}$ is lowered to the level represented by point B, the potential $P_{02}$ at the output end $O_2$ is changed from the L level to the H level. Thus, although the output potential $P_{01}$ is not completely changed to the L level, the potential $P_{02}$ at the output end $O_2$ of the input buffer IB in the external integrated circuit $IC_2$ is erroneously inverted.

Figure 4:
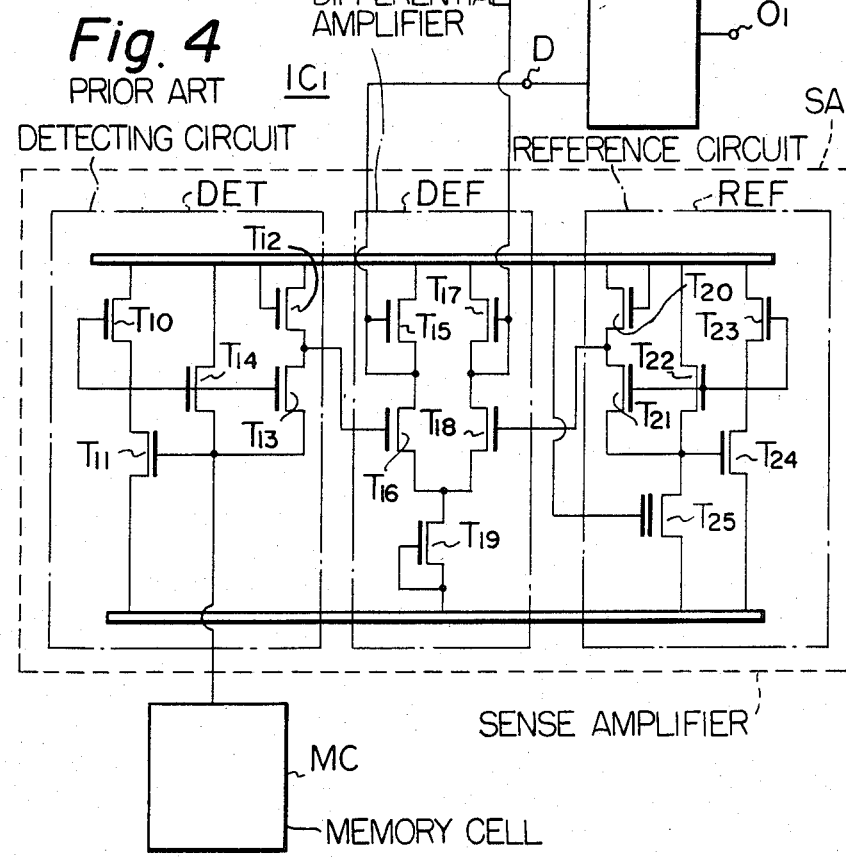

The potential variations of the ground line $V_{SS}$ also affect the operation of the internal integrated circuit $IC_{10}$. FIG. 4 is a circuit diagram illustrating a main portion of a well-known semiconductor memory device employed as the semiconductor device $IC_1$ of FIG. 2. In FIG. 4, the semiconductor memory device $IC_1$ comprises a memory cell MC, a sense amplifier SA for amplifying the output of the memory cell MC, and an output buffer OB. The sense amplifier SA comprises a detecting circuit DET for detecting the output of the memory cell MC, a reference circuit REF for outputting a reference signal of an intermediate level between the H level and the L level, and a differential amplifier DEF for amplifying the difference between the outputs of the detecting circuit DET and the reference circuit REF. The detecting circuit DET comprises the MOS transistors $T_{10}$, $T_{11}$, $T_{12}$, $T_{13}$ and $T_{14}$, and the reference circuit REF comprises the MOS transistors $T_{20}$, $T_{21}$, $T_{22}$, $T_{23}$, $T_{24}$ and a floating gate transistor $T_{25}$. As is well-known, by causing the floating gate transistor $T_{25}$ to have a mutual conductance gm of half that of the other transistors, the reference circuit REF can output the above-mentioned signal of an intermediate level. The differential amplifier DEF comprises the MOS transistors $T_{15}$, $T_{16}$, $T_{17}$, $T_{18}$, and $T_{19}$. The gate of the transistor $T_{16}$ receives the output from the detecting circuit DET, and the gate of the transistor $T_{18}$ receives the output from the reference circuit REF. The differential amplifier DEF compares these outputs and provides an H level signal or an L level signal to the input ends D and $\overline{D}$ of the output buffer OB.

If it is assumed that a large instantaneous current flows through the driving MOS transistor $T_6$ (FIG. 1) in the output buffer OUT so that the potential of the ground line $V_{SS}$ near the output buffer OB is raised, the ground potential of the reference circuit REF becomes higher than the ground potential of the detecting circuit DET. The ground potential of the differential amplifier DEF also becomes higher when the reference circuit REF in the sense amplifier SA is placed near the output buffer OB. As a result, the intermediate level of the potential at the output of the reference circuit REF is raised, thereby causing erroneous signals to be supplied from the differential amplifier DEF to the input ends D and $\overline{D}$ of the output buffer OB since the H level potential at the gate of the driving transistor $T_{16}$ becomes lower than the raised intermediate level potential.

When the differential amplifier DEF, the detecting circuit DET, or the memory cell MC is placed near the output buffer OB, similar erroneous signals may be supplied due to the variations of the ground line $V_{SS}$ near the output buffer OB.

Figure 5:
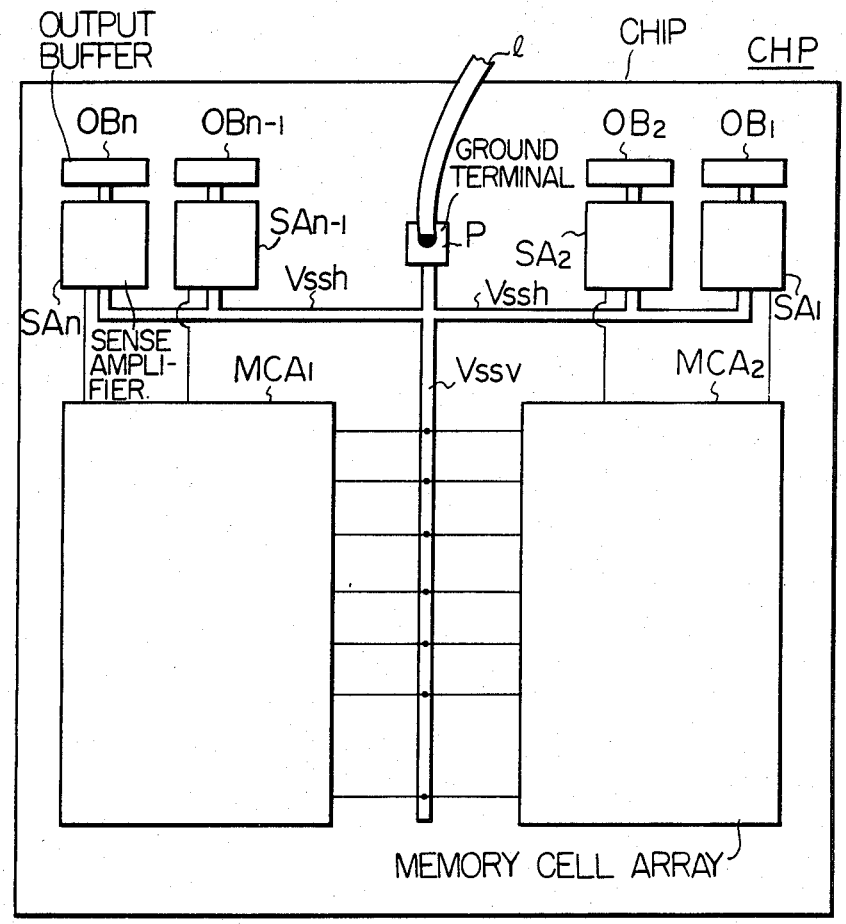

The unfavorable effects of fluctuations in the ground line potential on various circuits will be more clearly understood in conjunction with FIG. 5. FIG. 5 is a general plan view of a well-known one-chip semiconductor memory device. In the figure, a horizontal ground line Vssh and a vertical ground line Vssv are provided on a memory chip CHP. Sense amplifiers $SA_1$, $SA_2, \ldots$, and SAn and output buffers $OB_1$, $OB_2, \ldots$, and OBn placed near the sense amplifiers, respectively, are connected to the horizontal ground line Vssh, and memory cell arrays $MCA_1$ and $MCA_2$ are connected to the vertical ground line Vssv. The horizontal ground line Vssh and the vertical ground line Vssv are connected to a ground terminal P. The ground terminal P is connected through a lead wire l to the negative terminal of an external power supply (not shown).

If it is assumed that an instantaneous large current flows through the output driving transistor into the horizontal ground line Vssh, this large instantaneous current flows through the horizontal ground line Vssh and the lead wire l to the external power supply so that the potential of the horizontal ground line Vssh near the output buffer $OB_1$ is raised. Therefore, in this case, the sense amplifier $SA_1$ placed near the output buffer $OB_1$ is affected most strongly by the rise of the ground potential.

From the foregoing description with reference to FIGS. 1 through 5, it will be apparent that a large instantaneous current flowing through the output transistor in an output buffer has various unfavorable effects on the circuit connected to the output buffer.

Now the embodiments of the present invention will be described with reference to FIGS. 6 through 8.

Figure 6:
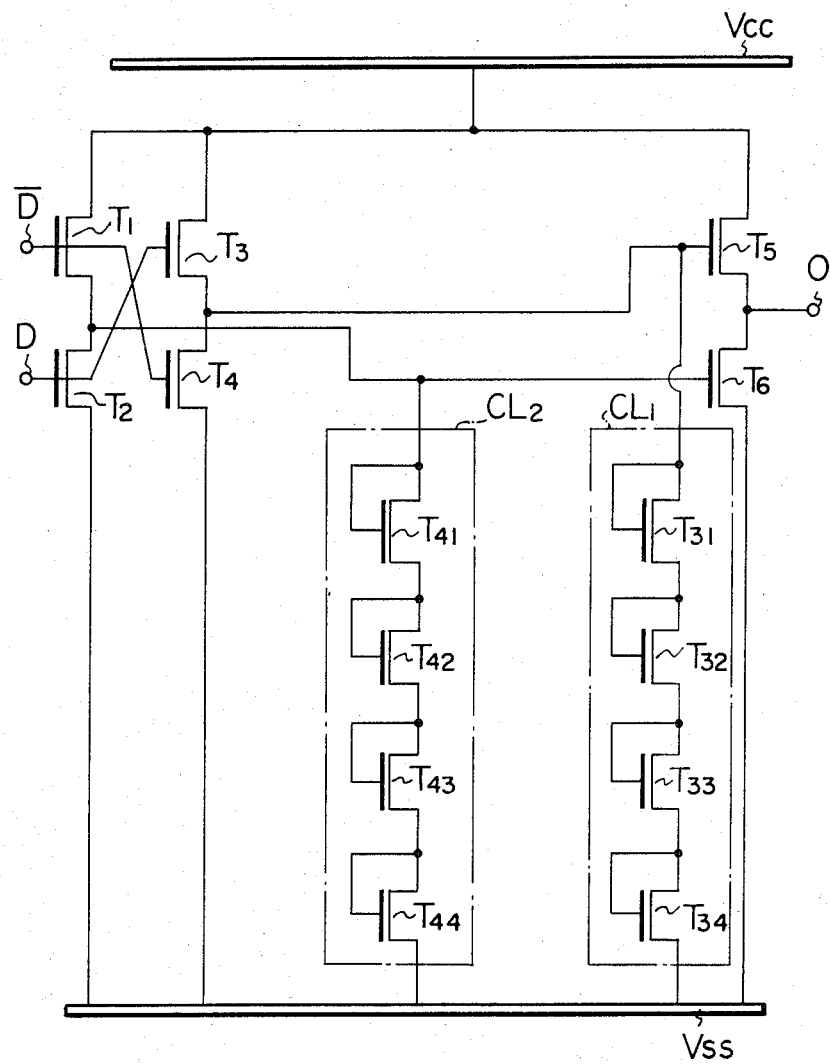

FIG. 6 is a circuit diagram illustrating an output buffer in a semiconductor device, according to a first embodiment of the present invention. In the figure, the same parts are designated by the same reference symbols as those used for the conventional output buffer of FIG. 1. The difference between the circuit of FIG. 1 and the circuit of FIG. 6 is that in FIG. 6 a clamping circuit $CL_1$ and a clamping circuit $CL_2$ are connected between the gate of the enhancement-type load N-MOS transistor $T_5$ and the ground line $V_{SS}$ and between the gate of the enhancement-type driving N-MOS transistor $T_6$ and the ground line $V_{SS}$, respectively. The clamping circuit $CL_1$ comprises four MOS transistors $T_{31}$, $T_{32}$, $T_{33}$, and $T_{34}$ connected in series. Also, the clamping circuit $CL_2$ comprises four MOS transistors $T_{41}$, $T_{42}$, $T_{43}$, and $T_{44}$ and connected in series. Each of the MOS transistors $T_{31}$, $T_{32}$, $T_{33}$, and $T_{34}$ and $T_{41}$, $T_{42}$, $T_{43}$, and $T_{44}$ has a drain and a gate connected to each other. Therefore, each of the MOS transistors in the clamping circuits $CL_1$ and $CL_2$ is equivalent to a diode.

As mentioned before, the specified power supply voltage of integrated circuits is usually within the range of 5 volts$\pm$0.25 volts. Within this range, when the power supply voltage becomes a higher voltage, the voltage applied to the gate of the output transistor $T_5$ or $T_6$ also becomes high if clamping circuits $CL_1$ and $CL_2$ are not provided. As a result, without the clamping circuits, the large instantaneous current flowing through one of the output transistors becomes larger. In contrast, by providing the clamping circuits $CL_1$ and $CL_2$, the gate voltage applied between the gate of the transistor $T_5$ or $T_6$ and the ground line is clamped at a predetermined voltage regardless of the increase in the power supply voltage, and, therefore, the current flowing through the output transistor $T_5$ and $T_6$ is limited to a small current. The above-mentioned predetermined voltage is determined within a range of from 4.75 volts to 5 volts by determining the number of transistors in each clamping circuit $CL_1$ or $CL_2$. It is preferable that the predetermined voltage be determined as the minimum voltage within the above-mentioned range so that the variations of the potentials of the power supply line or the ground line, due to the large instantaneous current flowing through one of the output transistors, do not have an unfavorable effect on the other circuits. When the clamping voltage is so determined, the operating speed of the output transistors $T_5$ and $T_6$ is not greatly decreased. More practically, when the specified power supply voltage is in the range of 5 volts$\pm$0.25 volts, the specified operating speed of the circuits, such as, for example, the accessing speed of the memory driven by the power supply voltage, is usually specified by employing the standard power supply voltage as the lowest voltage, i.e., 4.75 volts. In this case, the clamping voltage is determined to be 4.75 volts. As a result, even when the power supply voltage $V_{CC}$ is raised to 5.25 volts, since the gate voltages of the output transistors $T_5$ and $T_6$ are clamped at 4.75 volts, the instantaneous current flowing through the output transistor $T_5$ or $T_6$ during a transition is not caused to be very large.

FIG. 7 is a circuit diagram illustrating an output buffer according to a second embodiment of the present invention. In this second embodiment, the output buffer OB comprises the N-MOS transistors $T_1$ through $T_6$ as in the first embodiment (FIG. 6). The drains of the transistors $T_1$, $T_3$, and $T_5$ are connected to another additional power supply line $V_{CCO}$ which is connected to a clamping circuit $CL_3$. The clamping circuit $CL_3$ comprises a MOS transistor $T_{51}$ connected between the power supply lines $V_{CCO}$ and $V_{CC}$, resistors $R_1$ and $R_2$ connected in series between the power supply line $V_{CC}$ and the ground line $V_{SS}$, and a resistor $R_3$ and a MOS transistor $T_{52}$ connected in series between the power supply line $V_{CC}$ and the ground line $V_{SS}$. The gate of the transistor $T_{51}$ is connected to a connecting point IV between the resistor $R_3$ and the drain of the transistor $T_{52}$. The gate of the transistor $T_{52}$ is connected to a connecting point between the resistors $R_1$ and $R_2$.

The voltage of the power supply line $V_{CCO}$ is controlled by the clamping circuit $CL_3$ which clamps the voltage within a range of from 4.75 volts to 5 volts. That is, the resistor $R_3$ and the transistor $T_{52}$ comprise an inverter. Therefore, the potential at the connecting point IV between the resistor $R_3$ and the transistor $T_{52}$ is inversely proportional to the potential at the gate of the transistor $T_{52}$. Since the gate potential of the transistor $T_{52}$ is determined by a resistance-type potential divider comprised of the resistors $R_1$ and $R_2$, the potential at the point IV is inversely proportional to the potential at the power supply line $V_{CC}$. When the potential at the power supply line $V_{CC}$ begins to rise to a higher level, the gate potential of the transistor $T_{52}$ also begins to rise to a higher level so that the gate potential of the transistor $T_{51}$ becomes a lower level. As a result, the mutual conductance gm of the transistor $T_{51}$ is decreased so that only a limited current flows through the transistor $T_{51}$. Thus, the potential of the additional power supply line $V_{CCO}$ is clamped at a predetermined low level.

In the foregoing first or second embodiment, the output buffer OB constitutes an E-E push-pull inverter. However, according to the invention, a C-MOS (complementary MOS) output buffer may be substituted for the E-E push pull output buffer.

FIG. 8 is a circuit diagram of an output buffer according to a third embodiment of the present invention. In the figure, a C-MOS output buffer OB' is employed as an alternative to the E-E push-pull output buffer OB of FIG. 7. The C-MOS output buffer OB' comprises a P-MOS transistor $T_7$ and an N-MOS transistor $T_8$ connected in series between the additional power supply line $V_{CCO}$ and the ground line $V_{SS}$ and a P-MOS transistor $T_9$ and an N-MOS transistor $T_{10}$ connected in series between the additional power supply line $V_{CCO}$ and the ground line $V_{SS}$.

When the potential at the input end D is the L level, the P-MOS transistor $T_7$ is turned on and the N-MOS transistor $T_8$ is turned off so that the potential of the gates of the N-MOS transistor $T_{10}$ and the P-MOS transistor $T_9$ become the H level. Accordingly, the P-MOS transistor $T_9$ turns off and the N-MOS transistor $T_{10}$ turns on. In a manner similar to the second embodiment of FIG. 7, the potential at the additional power supply line $V_{CCO}$ is lowered when the potential at the power supply line $V_{CC}$ is increased. Therefore, the H level potential at the gate of the N-MOS transistor $T_{10}$ is lowered so that the instantaneous current which flows through the transistor $T_{10}$ during a transition of its state is decreased. Also, when the gate of the P-MOS transistor $T_9$ receives the L level potential to be turned on and when the potential at the power supply line $V_{CC}$ is increased so that the potential at the line $V_{CCO}$ is decreased, the voltage between the gate of the P-MOS transistor $T_9$ and the additional power supply line $V_{CCO}$ is decreased, resulting in a small instantaneous current which flows through the P-MOS transistor $T_9$.

In the second and third embodiments of FIGS. 7 and 8, the power supply line $V_{CCO}$ is clamped by the clamping circuit $CL_3$. As will be apparent to those skilled in the art, alternatively, the ground line $V_{SS}$ may be clamped by another clamping circuit.

From the foregoing description, it will be apparent that, according to the present invention, in an output buffer of a semiconductor device, since the instantaneous current flowing through one of the output transistors during a transition of its state is decreased, erroneous operation of the semiconductor device or unfavorable effects on an external circuit connected to the output buffer due to the instantaneous current can be greatly suppressed.

We claim:

1. An output circuit of a semiconductor device having a power supply line and a ground line and operatively connected to receive first and second signals, each of the first and second signals having a high or low-potential level, comprising:
    a first MIS transistor having a gate operatively connected to receive the first signal;
    a second MIS transistor operatively connected in series with said first MIS transistor and between the power supply line and the ground line, and having a gate operatively connected to receive the second signal, said first and said second MIS transistors being turned on and off or being turned off and on, respectively, in response to the high-potential level or the low-potential level of the first and second signals;
    an output terminal operatively connected to a connecting point between said first and said second MIS transistors; and
    a clamping circuit, directly connected to said gates of said first and second MIS transistors, for clamping the potentials of the first and second signals to within a predetermined level.

2. An output circuit as set forth in claim 1, wherein said clamping circuit comprises means for clamping the high-potential level of the first and second signals to a level lower than at least a predetermined level of the power supply line so that the high-potential level of the first and second signals is prevented from becoming a level higher than said predetermined level of the power supply line even when the potential of the power supply line varies.

3. An output circuit as set forth in claim 1, wherein said clamping circuit comprises:
    first-signal clamping means including a plurality of diodes connected in series between said gate of said first MIS transistor and the ground line; and
    second-signal clamping means including a plurality of diodes connected in series between said gate of said second MIS transistor and the ground line.

4. An output circuit as set forth in claims 1, 2, or 4, wherein said first and second MIS transistors form an enhancement-type N-MOS inverter.

5. An output circuit for a semiconductor device having a power supply line and a ground line and operatively connected to receive first and second signals, each of the first and second signals having a first or second potential level, said output circuit comprising:
    a first transistor having a gate operatively connected to receive the first signal;
    a second transistor, operatively connected in series with said first transistor forming a node therebetween, as an output terminal and operatively connected between the power supply line and the ground line, having a gate operatively connected to receive the second signal, said first and second transistors being turned on and off or off and on, respectively, in response to the first or second potential level of the first and second signals; and a clamping circuit, directly connected to said gates of said first and second transistors, for clamping the potentials of the first and second signals to within a predetermined level, said clamping circuit including:
first-signal clamping means, for clamping the first signal to a predetermined level, including a plurality of diodes connected in series between said gate of said first transistor and the ground line; and
second-signal clamping means, for clamping the second signal to a predetermined level, including a plurality of diodes connected in series between said gate of said second transistor and the ground line.

* * * * *

UNITED STATES PATENT AND TRADEMARK OFFICE
CERTIFICATE OF CORRECTION

PATENT NO. : 4,527,077

DATED : JULY 2, 1985

INVENTOR(S) : MITSUO HIGUCHI ET AL.

It is certified that error appears in the above-identified patent and that said Letters Patent is hereby corrected as shown below:

Col. 1, line 12, "line is" should be --line, is--.

Col. 5, line 43, "1" should be --$\ell$--;
       line 49, "1" should be --$\ell$--.

Col. 6, line 9, delete "and" (second occurrence).

Signed and Sealed this

Twenty-ninth Day of October 1985

[SEAL]

Attest:

DONALD J. QUIGG

Attesting Officer

Commissioner of Patents and
Trademarks—Designate